(12) United States Patent
Grootes et al.

(10) Patent No.: US 7,317,403 B2
(45) Date of Patent: Jan. 8, 2008

(54) LED LIGHT SOURCE FOR BACKLIGHTING WITH INTEGRATED ELECTRONICS

(75) Inventors: Pieter Grootes, Best (NL); Noboru Kaito, Tilburg (NL); Robert F. M. Hendriks, Overlangel (NL); Charles A. Schrama, Penang (MY); Emanuel Stassar, Sprang Capelle (NL); Dennis Claessens, Eindhoven (NL)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 302 days.

(21) Appl. No.: 11/212,185

(22) Filed: Aug. 26, 2005

(65) Prior Publication Data

US 2007/0046485 A1    Mar. 1, 2007

(51) Int. Cl.
G08B 5/22      (2006.01)
G09F 9/33      (2006.01)
G09G 3/36      (2006.01)

(52) U.S. Cl. .......................... 340/815.45; 340/815.47; 345/45; 345/102; 362/800

(58) Field of Classification Search .......... 340/815.45; 362/800; 345/102
See application file for complete search history.

(56) References Cited

U.S. PATENT DOCUMENTS 6,069,597 A * 5/2000 Hansen ....................... 345/74.1
6,150,774 A * 11/2000 Mueller et al. ............. 315/291
6,630,801 B2 * 10/2003 Schuurmans ................. 315/307
6,897,624 B2 * 5/2005 Lys et al. ..................... 315/297
2002/0070914 A1 * 6/2002 Bruning et al. ............. 345/102

OTHER PUBLICATIONS

"Synchronous Buck-Boost High Power White LED Driver," Linear Technology LTC3453 Data Sheet, pp. 1-12, Jan. 2004.
"480mA White LED 1x/1.5x/2x Charge Pump for Backlighting and Camera Flash," Maxim Integrated Products MAX1576 Data Sheet, pp. 1-14, Jan. 2004.
"LINEARlight Colormix OS-LM01M," OSRAM Data Sheet, pp. 1-4, Apr. 8, 2005.

* cited by examiner

Primary Examiner—Donnie L. Crosland
(74) Attorney, Agent, or Firm—Patent Law Group LLP; Brian D. Ogonowsky

(57) ABSTRACT

An LED backlight structure for setting voltages and currents for LEDs. Red LEDs are connected in series between a first voltage regulator and a first controllable current source, green LEDs are connected in series between a second voltage regulator and a second controllable current source, blue LEDs are connected in series between a third voltage regulator and a third controllable current source. The current sources may be linear current regulators controlled to balance the three colors to achieve a target light output of the board using a light detection chamber. PWM controllers control transistor switches connected in parallel across groups of LEDs, where the duty cycles set the average current through each group of LEDs. The control values used to achieve target light characteristics are stored in memory. The PWM controller may control brightness levels of the LEDs. The backlight may be for an LCD television.

31 Claims, 11 Drawing Sheets

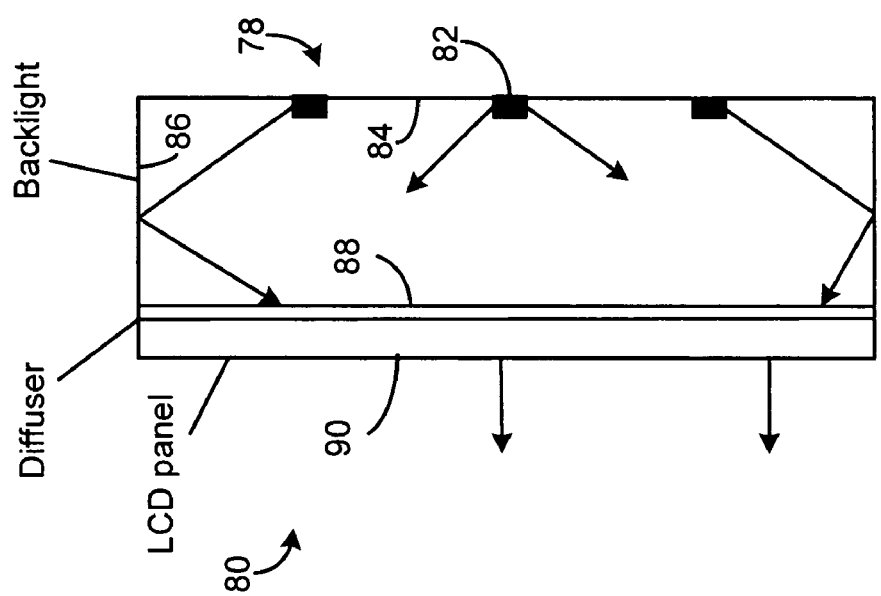

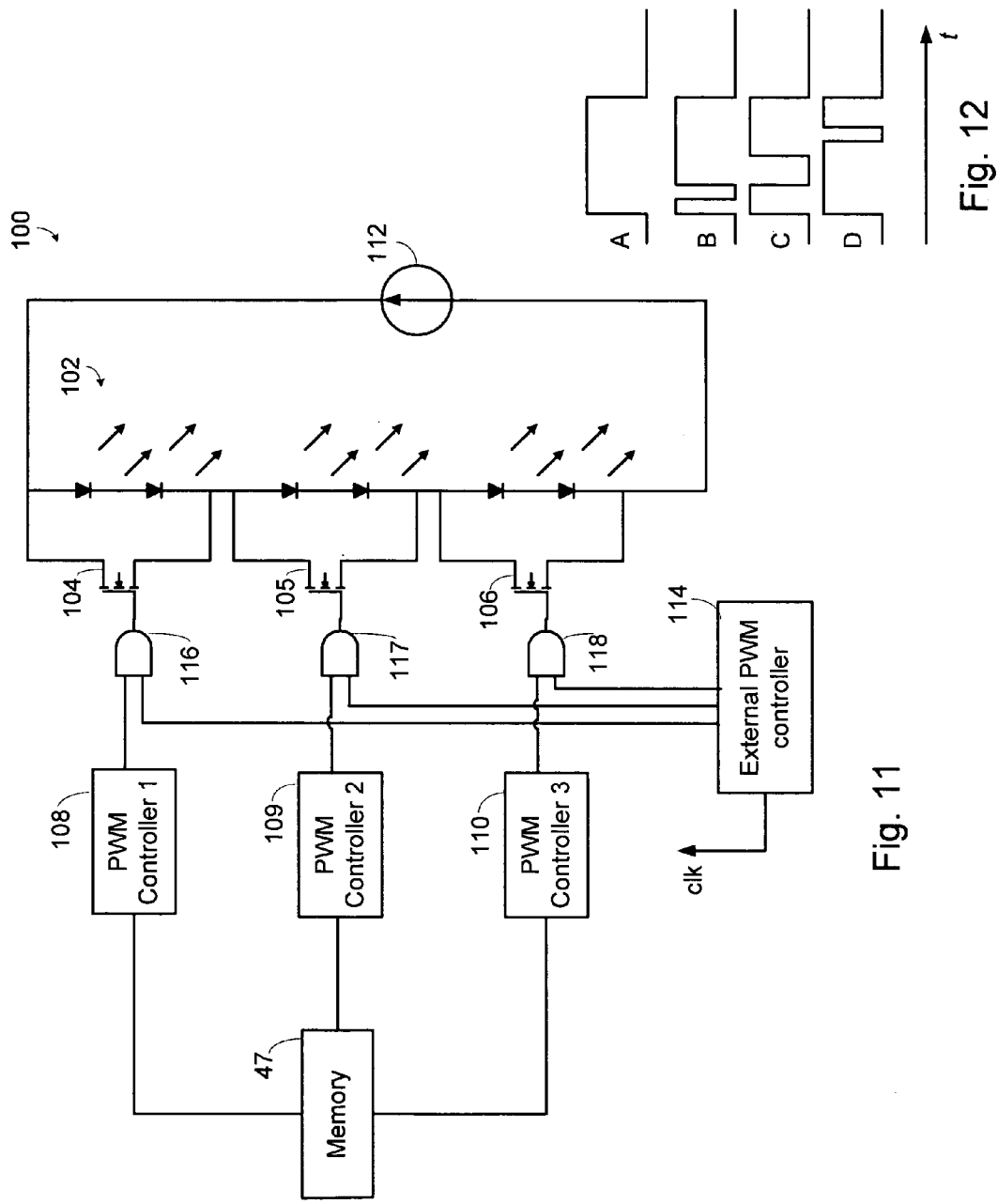

LED LIGHT SOURCE FOR BACKLIGHTING WITH INTEGRATED ELECTRONICS

FIELD OF THE INVENTION

This invention relates to controlling light emitting diodes (LEDs) for creating a white light backlight, such as for liquid crystal displays (LCDs).

BACKGROUND

LCDs require a backlight. For full color LCDs, the backlight is a white light. The white point of the white light is typically designated by the LCD manufacturer and may be different for different applications. The white point is specified as a temperature. One application of an LCD is a television or computer monitor.

Common white light backlights are created by either a fluorescent bulb or a combination of red, green, and blue LEDs.

For medium and large backlights, multiple LEDs of each color are used. All LEDs of one color on a printed circuit board (PCB) are typically connected in series. Generally, in backlights, external current drivers are used, each driving one string of red, green, or blue LEDs.

The amount of current through an LED controls the brightness. The most straightforward way to control the current of an LED driver, as shown in FIG. 1, is to measure the voltage across a current sense resistor 6 in series with the LEDs 8 (represented by a single LED) and compare this voltage, using a differential amplifier 10, to an accurate reference voltage Vref. The feedback loop automatically adjusts the output of the driver to cause the sense voltage to match the reference voltage.

An alternative is to use a linear current source with a separate voltage source, although this method is not commonly used for backlighting. FIG. 2 illustrates a series string of LEDs of a single color being driven by a linear current source 13. In a linear current source, the current is controlled by controlling the conductance of a pass transistor 14. The current source may be controlled to generate a preset current by detecting the current with a current detector 16 and applying the detected current as a feedback signal to a control circuit 18 to maintain the current at a preset level.

As shown in FIG. 3, the current detector may comprise a low value resistor 20 with a differential amplifier 22 measuring the voltage drop across the resistor 20. The control circuit 18 may be a second differential amplifier 24 that receives the current feedback signal and receives a settable reference voltage Vref. The amplifier 24 controls transistor 14 to maintain the output of amplifier 22 at Vref. Vref may be set by selecting a resistance in a voltage divider between a fixed voltage and ground or may be set by other means. An enable signal (EN) turns the amplifier 24 (and the transistor 14) on or off. Many other embodiments are possible.

Whichever of the above drivers are used, the common practice for backlighting is to control the current through the LED strings externally, i.e., not on the PCB. Furthermore to limit the number of drivers, multiple boards of LEDs are placed in series, with the consequence that the strings of equal color have the same drive current on multiple boards. Without further precautions, this will lead to large variations in brightness and color, due to the inherent variations in color and brightness between individual LEDs.

Generally, color and brightness uniformity is improved by selecting LEDs for specific locations on the boards. This is done by testing the individual LEDs, then "binning" each LED according to its characteristics, and then placing LEDs on the boards in accordance with precalculated bin patterns. Additionally, the boards' light emitting characteristics are measured after placing of the LED, and the boards are combined such that only boards with closely matching white points are used in a single backlight. This process is called grading. The process of using bin patterns and grading in an attempt to create boards with uniform light characteristics and achieve a target white point is costly and time consuming. Furthermore, variations within a PCB are not fully suppressed.

SUMMARY

An LED light source for backlighting is described that can store optimal current settings for strings of LEDs, such that color and brightness uniformity in the backlight application is ensured. Storing the optimal current settings for a particular light source board on the board results in all light source boards having uniform light output characteristics.

Instead of using binning and grading to precisely match the characteristics of the LEDs and predetermine the proper driving voltage and driving current, the LEDs are first mounted and electrically connected on a printed circuit board (PCB), then tested. The testing is typically performed by varying the driving signals and optically detecting the overall brightness of the LEDs. The voltage and current values may then be set to their optimum values based on the tested overall efficiency of the LEDs while already connected. The optimal driving voltage is one where there is a minimum voltage drop across the current source. The driving currents are set so that the board meets predetermined overall light output characteristics. This greatly simplifies the creation of the backlight since all the boards have uniform characteristics.

A memory is integrated on the LED PCB, where the memory stores the optimal current settings per LED string. When the backlight is powered up, the settings from the memory are downloaded and control the various current drivers to achieve the desired light output characteristics. The memory may also store optimal values for the driving voltage to minimize the voltage drop across the linear current source.

The length of the LED string on a PCB can vary between one LED to all LEDs of the same color that are on the PCB. The optimal string length should be determined by a cost/performance trade off, and will vary from application to application.

When clusters of LEDs are used in a reflective box for a backlight, the positions of the clusters in the box affect the uniformity of the light output by the LCD. For example, the light around the edges of the LCD can be brighter or dimmer than light in the middle of the LCD depending on reflections from the sidewalls of the box. To avoid this problem, the current to the clusters along the sides is reduced relative to the current to the clusters in the middle of the box. The settings are saved in the on-board memory. By enabling full control of the driving currents to the LEDs for each cluster, the currents may be tailored to obtain uniform light output across the LCD while achieving a desired white point.

In one embodiment, each series string is connected at one end to a voltage regulator that sets the voltage to an optimum voltage so that almost all of the voltage is dropped across the series string. The other end of each series string is connected to a controllable linear current source to adjust the brightness of each series string. The voltage drop across the current source is minimal so that energy is not wasted.

There may be only one series string for each color, or multiple series strings for a single color may be connected in parallel, or each individual LED may be connected across its own voltage regulator and current source, or there may be a combination of the above arrangements.

In another embodiment, a PWM controller controls a transistor in parallel with one or more LEDs in a serial string mounted on a printed circuit board. There may be a separate transistor in parallel with different groups of LEDs in the serial string. The transistors are each controlled with a separate PWM controller on the PCB to substantially equalize the brightness of each group of LEDs and make the overall brightness of the entire string or cluster match a target value. A separate set of PWM controllers is provided for each LED color. The control values for each PWM controller are set to cause the board to have a target light output (e.g., predetermined brightness and white point). These control values are stored in a memory on the board. When the board is powered up, the control values from the memory are used to set the PWM duty cycles so that the board meets the target light output characteristics. In this way, all boards have the same light output characteristics when sold to the customers. Additionally, the brightness of each string of LEDs may be separately controlled by an external PWM or amplitude modulation controller (operating in conjunction with the aforementioned PWM controllers) to allow the user to adjust the brightness and white point to meet the particular specifications of the user.

In one example, the backlight is for a large LCD television. Each primary color is created by one or more series strings of a single color LED. The primary colors used are red, green, and blue; however, secondary colors or other colors may be used.

BRIEF DESCRIPTION OF THE DRAWINGS

FIG. 10 illustrates an LCD using the backlight of the present invention.

FIG. 11 is another embodiment of a portion of the inventive backlight PCB for a single color, illustrating PWM controllers controlling transistors in parallel with sections of the series string of LEDs.

FIG. 12 illustrates the relative duty cycles of the PWM controllers in FIG. 11.

Elements designated with the same numerals may be the same or equivalent.

DETAILED DESCRIPTION

Figure 4:
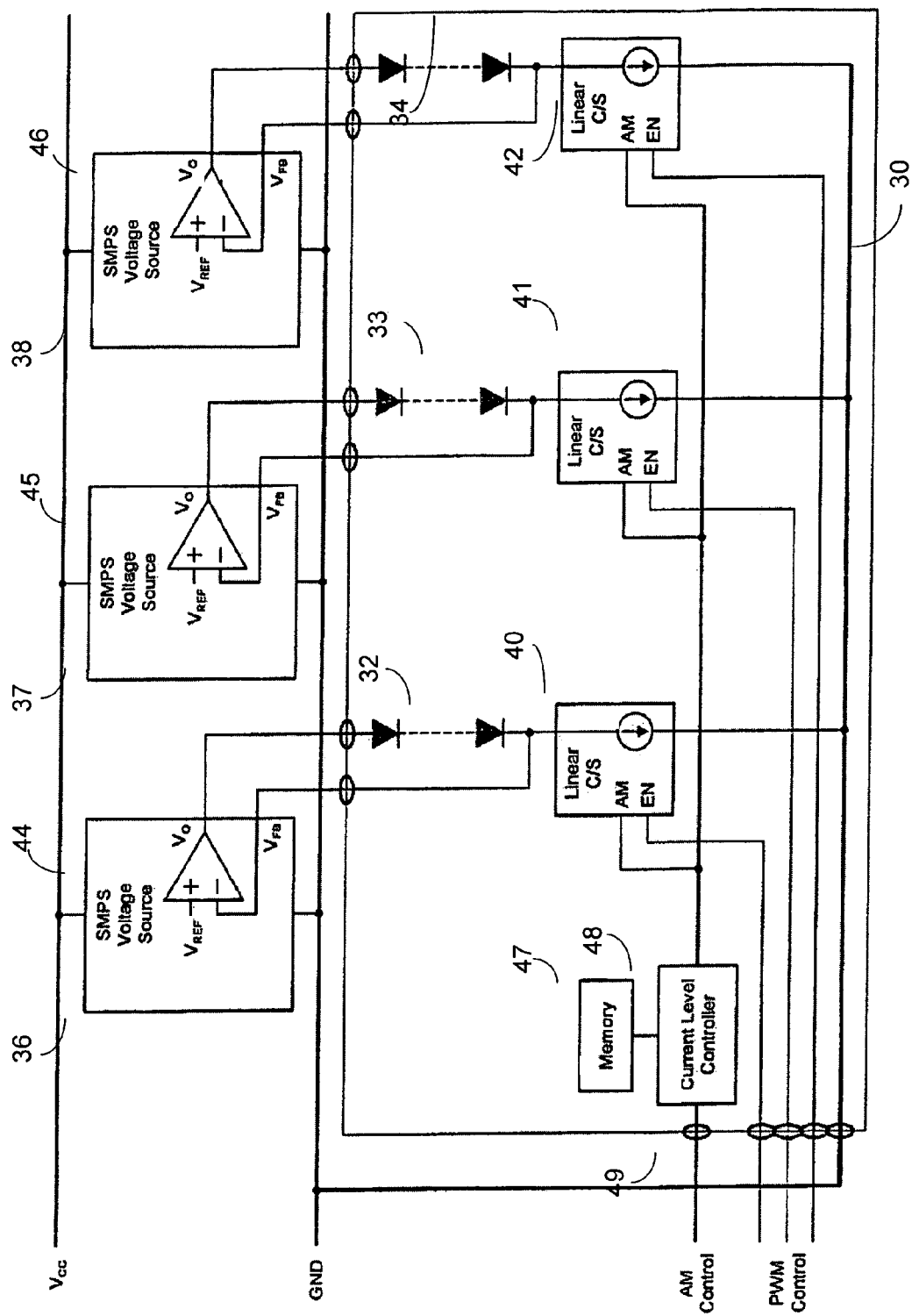
FIG. 4 illustrates one embodiment of the inventive backlight PCB where each series string of LEDs is controlled by its own voltage regulator and current regulator, and the driver settings are stored in an on-board memory.

FIG. 4 illustrates the electronics and light source of a backlight PCB for an LCD. In one embodiment, the LEDs and current sources are mounted on a single printed circuit board (PCB) 30. In another embodiment, the voltage regulators are also mounted on the PCB 30.

Series strings of red LEDs 32, green LEDs 33, and blue LEDs 34 are shown. By adjusting the currents through the RGB LEDs, any white point may be achieved by the backlight.

The anode of each string is connected to its own voltage regulator 36, 37, 38, and the cathode of each string is connected to its own current source 40, 41, 42.

The voltage regulators are preferably switching regulators, sometimes referred to as switch mode power supplies (SMPS). Switching regulators are very efficient. One suitable type is a conventional pulse width modulation (PWM) regulator. The regulators are represented as a differential amplifier 44, 45, 46 outputting a voltage Vo and receiving a reference voltage Vref and a feedback voltage Vfb. The input voltage Vcc can be any value within a range. Each voltage regulator 36-38 maintains Vo so that Vfb is equal to Vref. Vref is set so that Vfb is approximately the minimum voltage (e.g., 100 mV-1 V) needed to drop across the current source (described below) for adequate operation. By maintaining Vo at a level only slightly above the combined forward voltages of the series LEDs, excess voltage is not dropped across the current source. Thus, there is a minimum of energy (and heat) dissipated by the current source. The voltage dropped across the current source should be less than 2 volts.

The optimum Vref for each voltage regulator may be determined empirically. Since each string of LEDs has its own forward voltage, the Vref for each voltage regulator 36-38 may be different.

Each voltage regulator may be a buck-boost PWM switching regulator such as used in the LTC3453 Synchronous Buck-Boost High Power White LED Driver, whose data sheet is incorporated by reference. Such buck-boost regulators are well known and need not be described herein.

Figure 3:
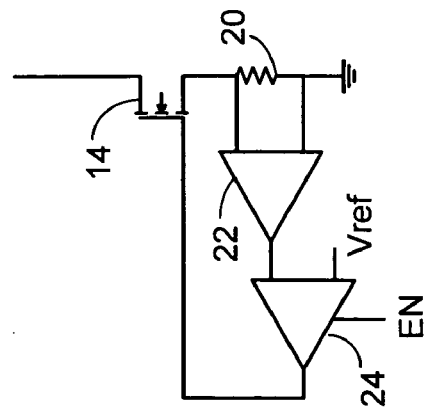
FIG. 3 illustrates one embodiment of a prior art linear current source.
Figure 2:
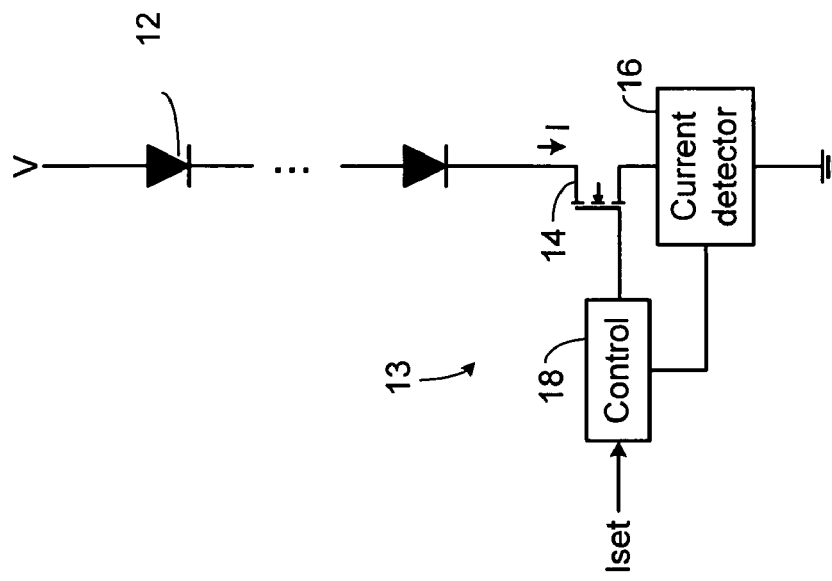
FIG. 2 illustrates a prior art series arrangement of LEDs controlled by a linear current source.
Figure 1:
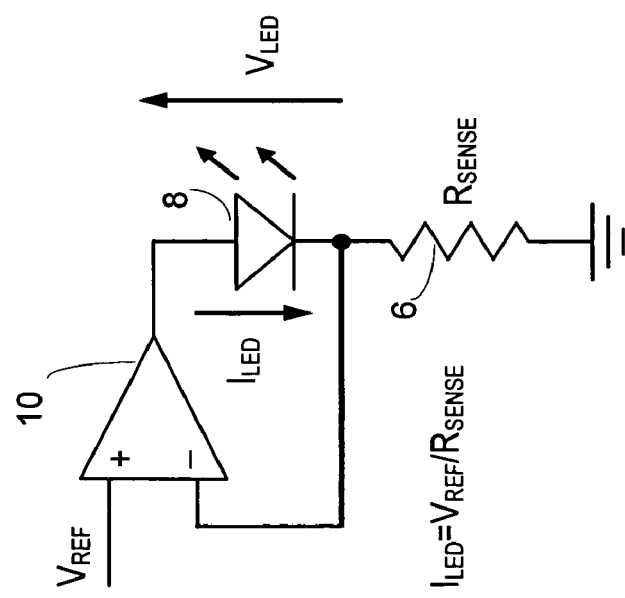
FIG. 1 illustrates a prior art arrangement of LEDs controlled by a current source.

Each current source 40-42 is controllable to control the brightness of its associated LEDs to achieve the desired white point. Each current source may be that shown in FIG. 1, 2, or 3, with control inputs being Vref (or Iset) and enable (EN). In FIG. 4, the Vref or Iset terminals are labeled AM (amplitude modulation), and the EN terminals are coupled to a PWM controller. Either the magnitude of AM or the duty cycle of EN may be used to control the brightness of the respective LEDs. The AM lead is used to control the "linear" conductivity of the pass transistor 14 when the current source is enabled by the signal EN.

In a backlight, the white point is controlled by the balance of the R, G, and B intensities. Although the LCD may have a user-controlled brightness control that controls the overall combined brightness of the R, G, and B LEDs (i.e., the gray scale), the balance (white point) between the three colors is still retained. In one embodiment, this balance is achieved by selecting the AM signal for each current source that provides the desired white point (or other target characteristic) and fixing the AM value for each current source. The light sensing may be performed in a conventional light detection chamber. In FIG. 4, the AM input may be a resistance, a voltage, a current, or any other value that sets the balance for the three primary colors.

In another embodiment, the AM signal for each current source is empirically selected to achieve any other desired balance, not necessarily the white point. For example, the AM values may be chosen simply to cause the light output of all boards to be identical when controlled with the same PWM signals even though the individual LEDs on the different boards have different characteristics. The PWM signals are then set by the user to achieve the desired white point. In other words, the AM signal causes all boards to have the same light characteristics when controlled with the same PWM signals.

The AM control value for each of the current sources 40-42 may be programmed into an on-board memory 47 for setting the desired balance between the LED strings. The digital values in memory 47 are then converted to the appropriate control signals by a current level controller 48. For example, the digital signals may be converted by a D/A converter and used as a reference voltage. The size of the memory 47 is determined by the required accuracy of the AM signal and the number of drivers to control. The levels may be controlled and programmed via an AM control pin 49. Although only a single line is shown output from the current level control 48, there may be one or more lines from the current level control 48 to each current source 40-42.

The memory 47 need not be an integrated circuit memory but may take any form, including variable resistors, etc.

The overall intensity of the backlight (the gray scale) may be controlled by controlling the duty cycle of the current sources at a relatively high frequency to avoid flicker. The duty cycle is the ratio of the on-time to the total time. Conventional PWM controllers may be used to output a square wave of the desired frequency and duty cycle. Since the same change in duty cycle may not control the brightness of red, green, and blue LEDs by the same amount, a separate PWM input is usually needed for each color. The change in duty cycle for each color to maintain the white point is determined empirically, and the outputs of the PWM controllers are adjusted accordingly.

Figure 8:
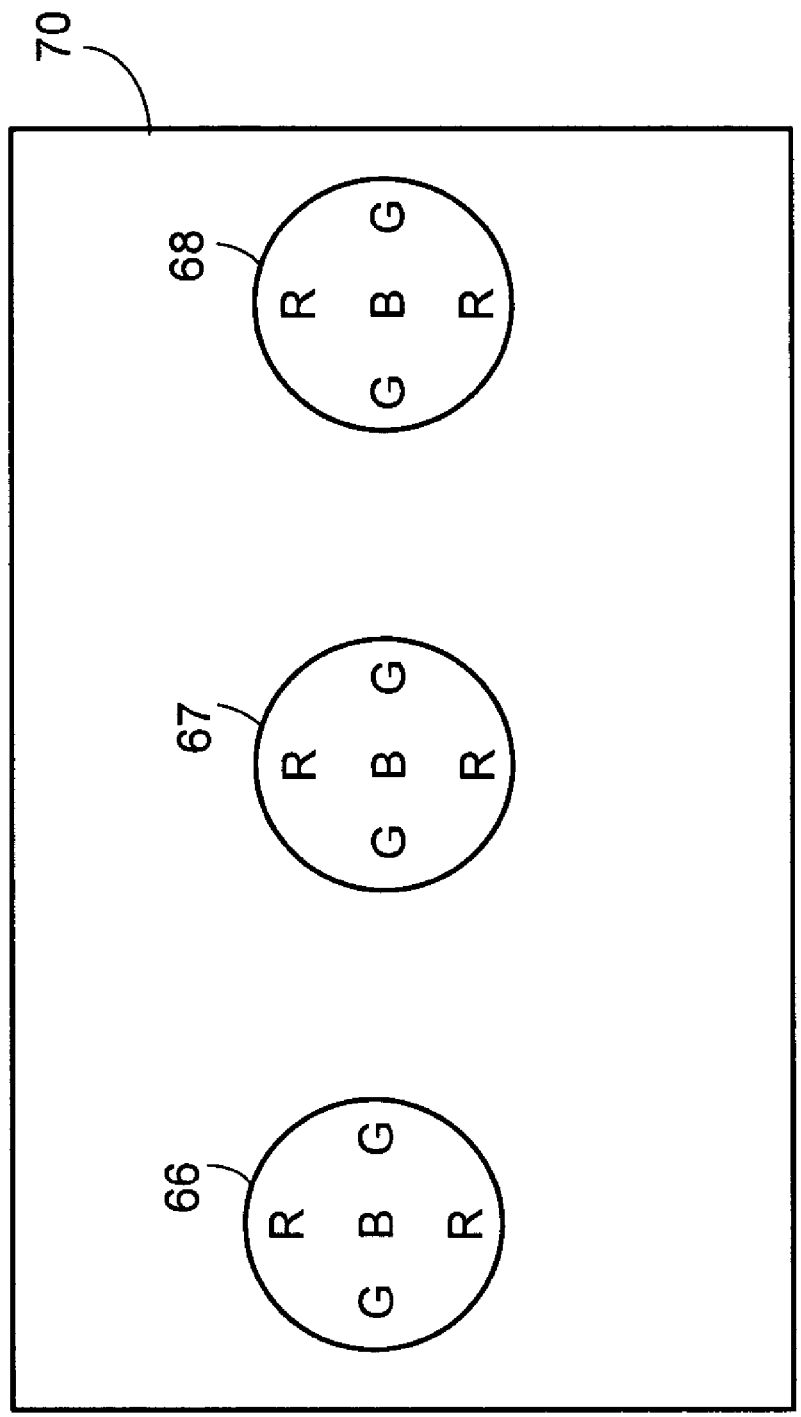
FIG. 8 illustrates clusters of RGB LEDs in a backlight.
Figure 9:
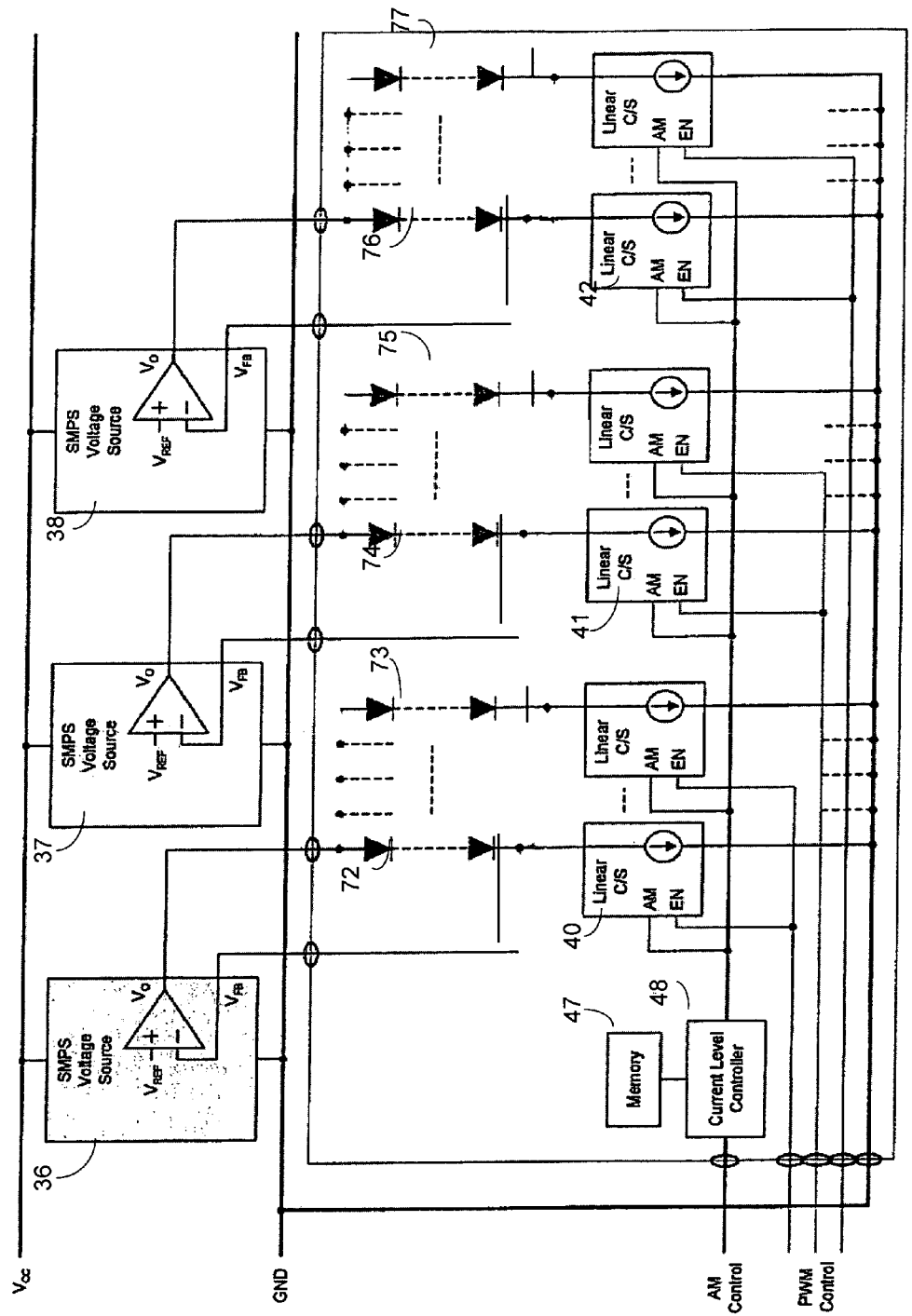
FIG. 9 illustrates another embodiment of the inventive backlight PCB where each series string of LEDs in a cluster is controlled by its own voltage regulator and current regulator.

Further, the PWM control signals may be used to control different sections of the backlight differently, as further described with respect to FIGS. 8 and 9.

The PWM settings may be determined by the user based on the specific requirements for the application in which the backlight is incorporated. For example, the control signals for the PWM controllers may be set by the user in hardware (e.g, by resistors) or may be set using digital signals from an external device, where the digital signals are converted to a control voltage. A programmed microprocessor, a memory, or other controller may provide the control signals to the PWM controller. The AM values stored in the on-board memory 47 are used to offset intrinsic variations between the LED strings.

Figure 5:
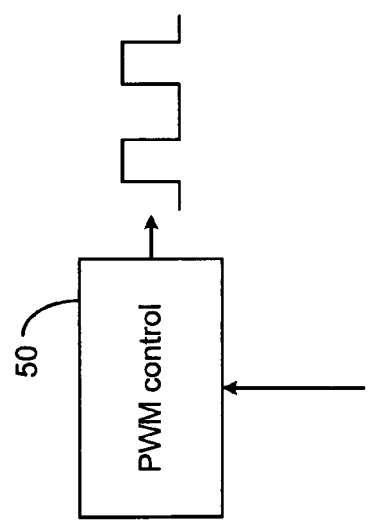
FIG. 5 illustrates a PWM controller of any type that outputs a square wave whose duty cycle is set to control the current through an LED series string.

FIG. 5 illustrates any of the PWM controllers 50, connected to a PWM control line in FIG. 4, that receive a control signal to vary the duty cycle of an oscillator operating at a fixed frequency.

Figure 6:
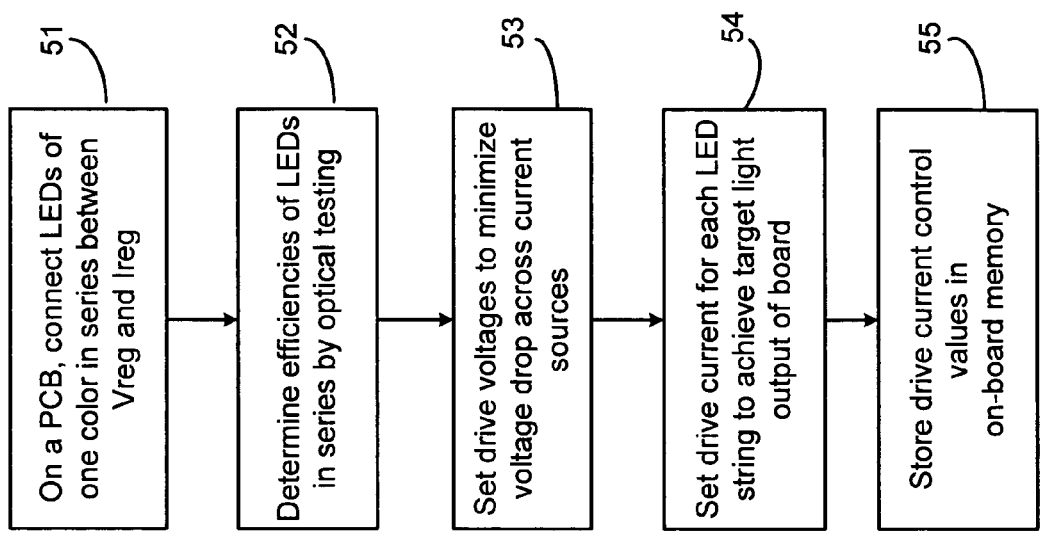
FIG. 6 is a flowchart of one embodiment of the inventive method of controlling LEDs in a backlight.

FIG. 6 summarizes the basic steps of the process to set the white point (or other target light output) and maximize efficiency. In step 51, the LEDs are mounted on a PCB and connected in series between the voltage regulator and the current regulator. In step 52, the efficiencies (drive signal vs. brightness) of the LEDs are tested by, for example, adjusting the drive signals and monitoring the brightness in a light detection chamber. The outcome of the test is then used to determine the drive settings for the LED strings required to meet the target light output (color point and brightness). All boards for the same application should have the same target light output. In step 53, the drive voltages are set for maximum efficiency (i.e., minimum energy dissipation by the current source). Step 53 is optional. In step 54, the current controls (AM signals) are set to control the individual R, G, and B brightness to achieve the desired target light output of the board 30. In step 55, the selected drive values are stored in the on-board memory so that uniform light characteristics are reproduced in the backlight application.

Figure 7:
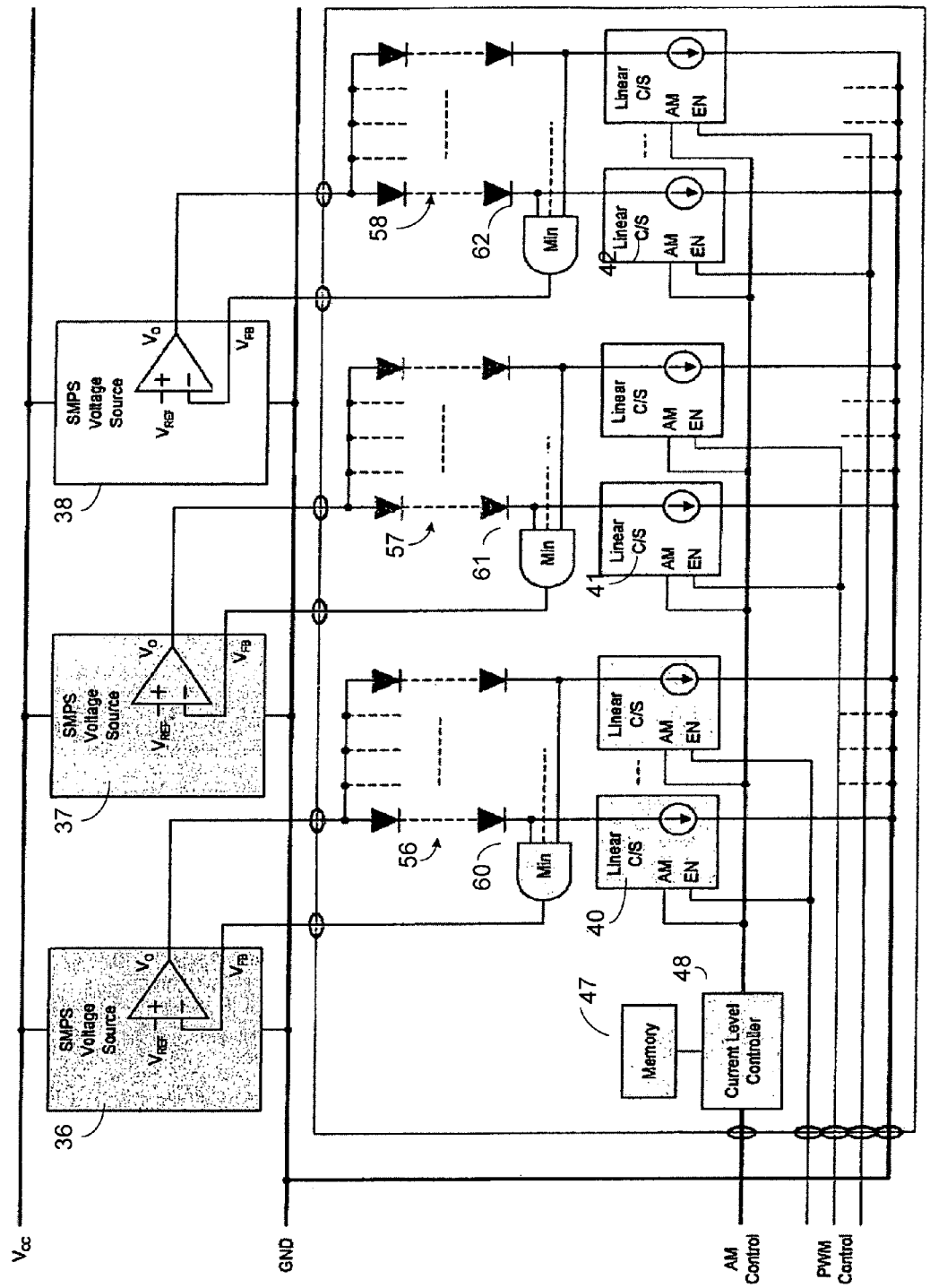
FIG. 7 illustrates another embodiment of the inventive backlight PCB where each series/parallel arrangement of LEDs is controlled by its own voltage regulator and current regulator.

FIG. 7 illustrates another embodiment of the backlight, where there are multiple series strings connected in parallel (series/parallel groups 56, 57, and 58) for each primary color. Since the forward voltage (i.e., on voltage) for each series string connected in parallel may be different, it is important that the driving voltage be greater than the highest forward voltage in the group. A minimum voltage detector 60, 61, 62 for each group detects when all of the voltages at the cathodes of the series strings have exceeded a certain minimum voltage. At that point, the feedback voltage Vfb is set for that series/parallel group of LEDs. All other aspects are the same as described with respect to FIG. 4.

FIG. 8 illustrates clusters 66, 67, 68 of RGB LED dies, where each cluster generates white light when its colors are mixed. In the cluster example, there are two red LEDs connected in series, two green LEDs connected in series, and one blue LED. Other combinations of RGB LEDs in a cluster are also suitable. The clusters are distributed in a reflective box 70 for mixing the light. An LCD panel (not shown) is mounted over the front opening of the backlight box 70. There may be many more clusters in a box, depending on the size of the LCD.

It is important that the light across the LCD be uniform. Due to the proximity of the clusters 66 and 68 to the reflective sides of the box 70, the edges of the LCD can have a different brightness than in the middle. To adjust the brightness of those edge clusters to achieve uniform illumination, the current through those LEDs must be different from the currents through the LEDs located in the middle of the box 70.

FIG. 9 illustrates an embodiment of a backlight that separately controls each color of LEDs in each cluster. Thus, the brightness of any cluster may be individually controlled to achieve uniform brightness across the LCD after the clusters have been mounted on the board. In FIG. 9, red LEDs 72 in series in a middle cluster are controlled separately from red LEDs 73 in an edge cluster. The voltage regulator connected to the series string of LED 73 is not shown for simplicity. Other strings of red LEDs are shown by dashed lines and have their own voltage regulators and current sources. The relative brightness of any series string may be individually fixed by the AM control and/or PWM control to set the white point and achieve uniform illumination of the LCD panel. The separate controls for the blue LEDs strings 74, 75 and green LED strings 76, 77 are also shown.

The PWM control may be used to control the overall brightness (grayscale) and color balance.

If each color of LEDs in each cluster is separately controlled and the clusters of FIG. 8 are used in the backlight, then there would be no blue LEDs connected in series since there is only one blue LED per cluster.

In another embodiment, each individual LED in the backlight is separately controlled.

FIG. 10 is a cross-sectional view of the backlight 78 of the present invention as part of an LCD 80 or other display that uses a backlight. Common uses are for televisions, monitors, cellular phones, etc. One or more of the RGB LED clusters 82, described above, are mounted on a printed circuit board 84. The clusters 82 may form a two-dimensional array. The bottom and sidewalls 86 of the backlight box are preferably coated with a white reflectively-diffusing material. The light from the various multicolored LEDs is mixed in the box to create a uniform white light. A diffuser 88 further mixes the light. An LCD panel 90 has controllable RGB pixels (shutters) and polarizers to create a full color image. RGB filters (not shown) may be used to illuminate the RGB pixel areas with the appropriate light color. Alternatively, the red, green, and blue LEDs may be sequentially energized to eliminate the need for the RGB filters.

FIG. 11 illustrates another embodiment of a backlight PCB 100. Only the circuitry for a single color of LEDs is shown. The circuitry may be duplicated for each LED color on the board.

A string of LEDs 102 is divided into groups. Three groups are shown. There may be any number of groups, including one group. Each group has a transistor connected in parallel with the group. MOSFETs 104, 105, and 106 are shown as examples, although bipolar transistors or other types of switches may be used. The on/off duty cycle of each transistor is controlled by an associated PWM controller 108, 109, 110. Each PWM controller may be the type that contains an oscillator generating a sawtooth waveform at the switching frequency. The PWM controller switches the transistor on at the beginning of the cycle and turns the transistor off when the rising sawtooth exceeds a threshold level. The threshold is set by a control voltage applied to the PWM controller. Many other types of PWM controllers can be used instead.

A constant current source 112 of any suitable type supplies a constant current through the string of LEDs or through any transistor that is turned on. If a transistor is turned on, the current bypasses the group of LEDs and passes through the transistor. The constant current source 112 should be robust enough to not significantly vary its current when the voltage drop suddenly changes by a transistor turning on.

The PWM controllers 108-110 are controlled during testing of the board 100 so that the brightness of each group meets a target brightness level. The duty cycle for each group determines the average current through the LEDs in that group, and the average current determines the perceived brightness. Due to different efficiencies of the individual LEDs, each group may have a different duty cycle to achieve the target brightness. If each group meets the target brightness level, then the overall brightness of the entire serial string will achieve a target brightness. If this is performed for each color of LEDs, the overall brightness and white point of the board will meet a predetermined target brightness and white point. Accordingly, all boards will have the same light output characteristics when operated with the control values determined during testing the individual boards.

Digital representations of these control values are stored in an on-board memory 47. Upon the board being powered-up, the stored digital values are converted into the control voltages by suitable D/A circuitry or other means so that the board produces the baseline target light output.

Typically, the user wants control over the overall brightness and white point of the backlight. A external PWM controller 114 is provided for each color of LEDs to vary the brightness of each serial string of LEDs. In this way, the RGB balance and overall brightness of the backlight may be adjusted by the user. In one embodiment, the external PWM controller 114 generates a blanking signal for each PWM controller 108-110 at a frequency that is the same as or higher than the switching frequency of the PWM controllers 108-110. AND gates 116-118 are used for blanking the PWM signals. The switching frequency of the external PWM controller 114 will typically be 1 to 128 times that of the frequency of the controllers 108-110. In one embodiment, the external PWM controller 114 generates a common clock for synchronizing all the controllers 108-110 and 114.

FIG. 12 illustrates sample waveforms for each PWM controller 114 and 108-110, labeled A, B, C, and D, respectively. This assumes all controllers receive a common clock.

Figure 13:
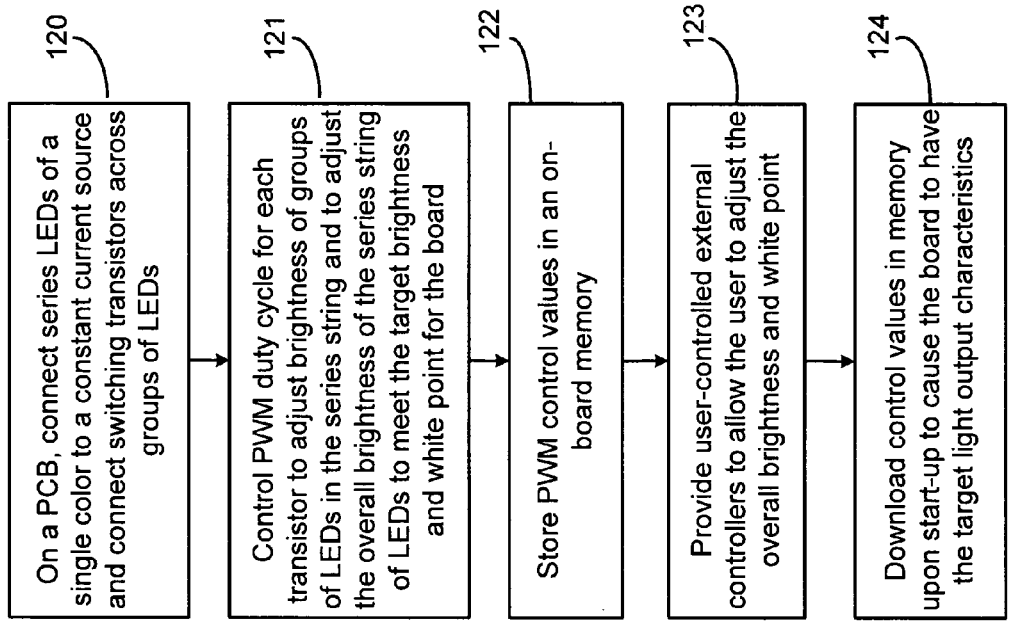
FIG. 13 is a flowchart of the method for operating the controllers of FIGS. 11, 14, and 15.

FIG. 13 is a flowchart of the method for achieving target light output values for each board 100. In step 120, the LEDs are connected on a PCB. In one embodiment, there are red, green, and blue LEDs, with the LEDs of a single color connected in series. Other connections, such as series/parallel or one LED per color are also envisioned. Switching transistors are connected across groups of LEDs. A constant current source for each color drives the LEDs.

In step 121, a PWM controller is connected to each switching transistor to control the relative brightnesses of the LED groups to meet a target brightness of each group and a target brightness of the particular color.

In step 122, the control values of the PWM controllers used to meet the target values are stored in an on-board memory. In all embodiments of the light boards, the memory may instead be external to the board.

In step 123, the user may provide and adjust external PWM controllers or other suitable controllers to adjust the brightness of each particular color to allow the user to control the overall brightness and white point of the board.

In step 124, upon the board being powered up, the control values from the memory cause the board to have the target light output characteristics, which are consistent from board to board. The user can then adjust these target characteristics to meet the user's particular specifications for brightness and white point.

Figure 14:
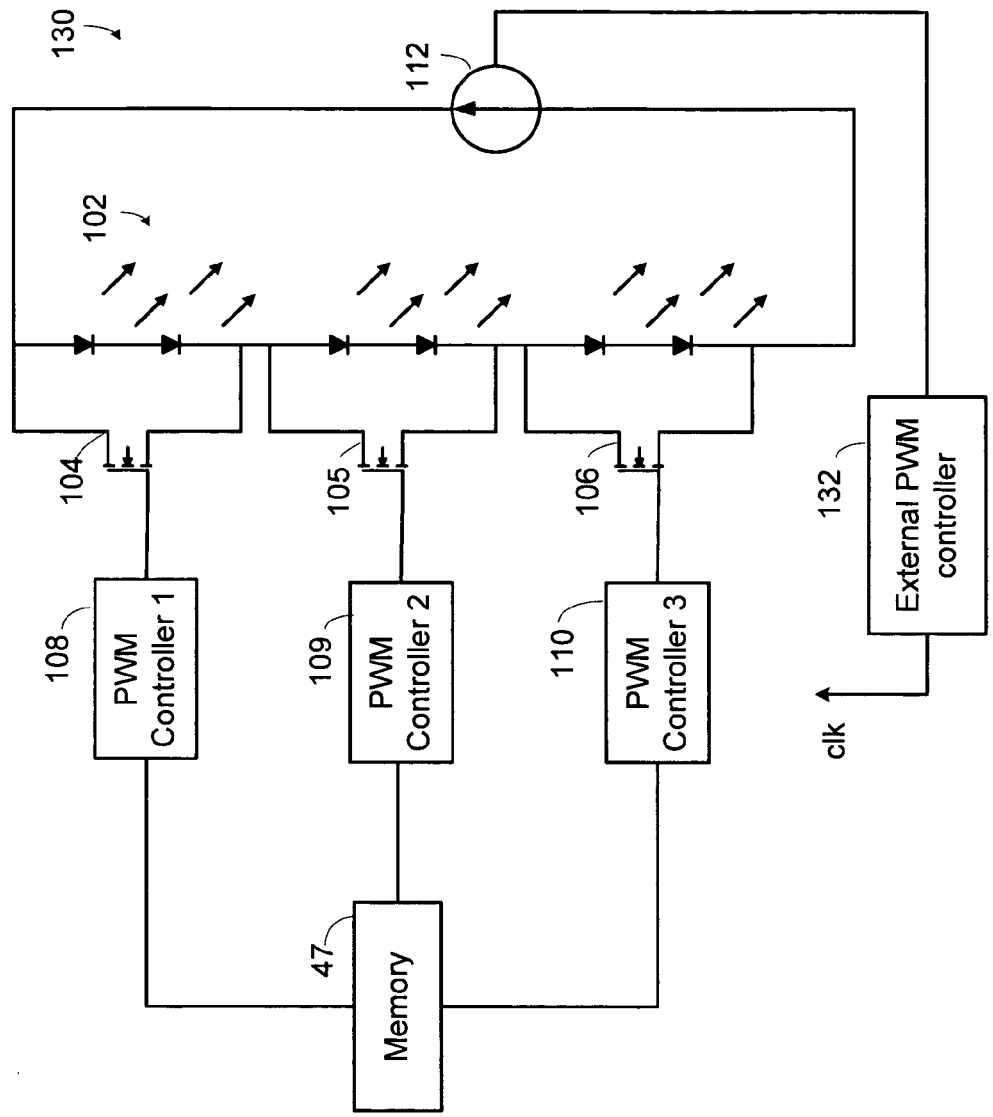
FIG. 14 is a variation of the backlight PCB of FIG. 11.

FIG. 14 illustrates an embodiment of a portion of a board 120, showing the circuitry for one color only (e.g., R, G, or B), where the external PWM controller 132 controls the duty cycle of the constant current source 112. One way to do this is by intermittently removing power from the current source or disconnecting it from the circuit.

Figure 15:
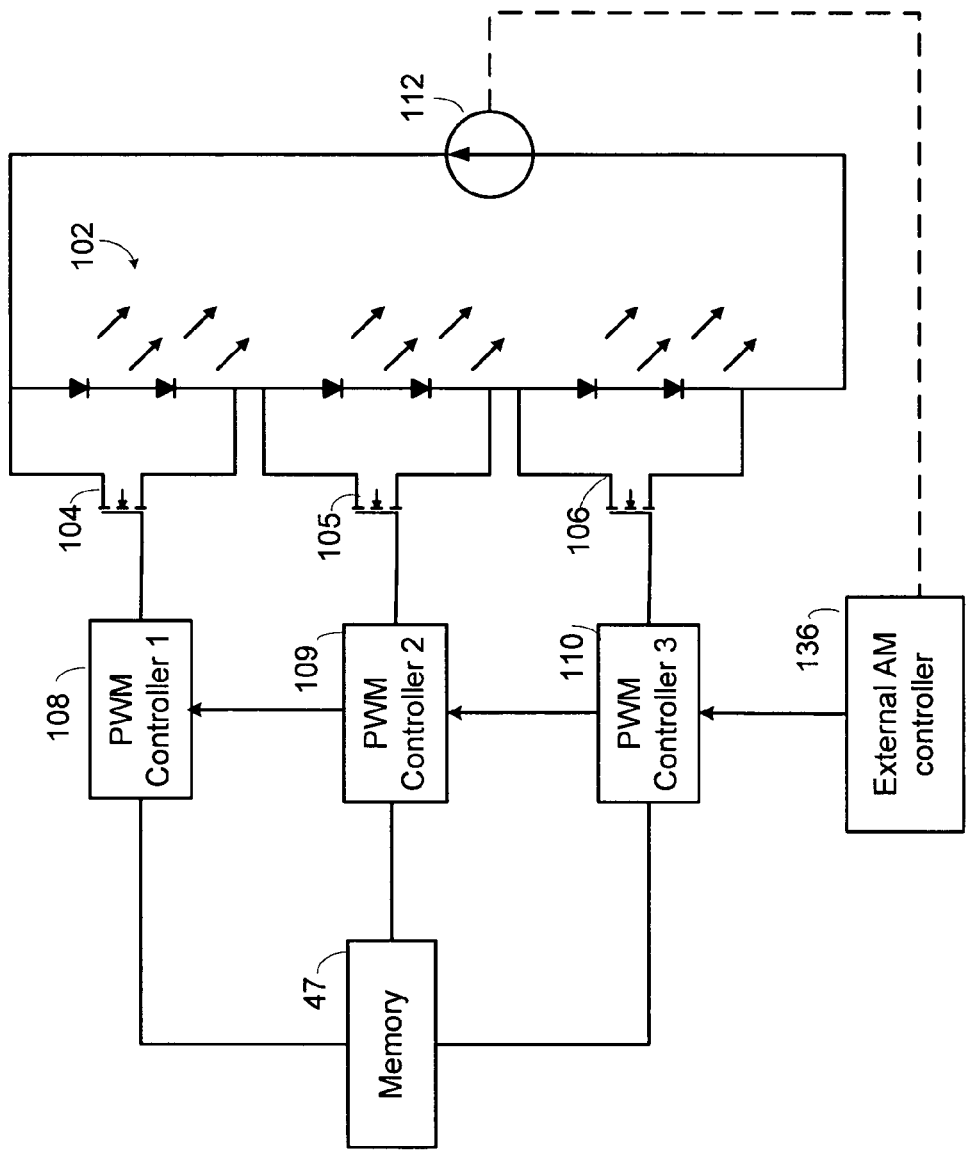
FIG. 15 is another variation of the backlight PCB of FIG. 11.

FIG. 15 is an alternative embodiment where the external PWM controllers 114 and 132 in FIGS. 11 and 14 are replaced by an amplitude modulation (AM) controller 136 that adjusts either the magnitude of the gate drive voltages for the switching transistors 104-106 or the magnitude of the current generated by the constant current source 112. The control line for the constant current source 112 is shown as a dashed line to illustrate the control as an alternative to varying the gate drive voltages.

Other techniques for controlling the brightness of the LEDs may also be used.

Various combinations of the above-described circuits may be possible.

Having described the invention in detail, those skilled in the art will appreciate that, given the present disclosure, modifications may be made to the invention without departing from the spirit and inventive concepts described herein. Therefore, it is not intended that the scope of the invention be limited to the specific embodiments illustrated and described.

What is claimed is:

1. A light emitting diode (LED) light source for use in a backlight for a display comprising:
    at least one LED of a first color;
    at least one LED of a second color;
    at least one LED of a third color;
    a plurality of current controllers, each controller connected to at least one LED of the first color, at least one LED of the second color, and at least one LED of the third color for controlling a brightness level of each color;
    the at least one LED of the first color, the at least one LED of the second color, the at least one LED of the third color, and the plurality of controllers being mounted on a same circuit board; and
    a memory mounted on the circuit board, the memory storing values for controlling an output current magnitude of each of the controllers so that a combined light output of the light source has characteristics set by the values stored in the memory.

2. The light source of claim 1 where the values in the memory control the controllers to achieve a target white point.

3. The light source of claim 1 where the values in the memory control the controllers such that light characteristics of the board are substantially the same as light characteristics of another board despite the LEDs on the two boards having different operating characteristics.

4. The light source of claim 1 where the first color is red, the second color is green, and the third color is blue, wherein the values in memory control the controllers to set the relative brightness of the red, green, and blue colors to achieve a desired overall light output from the board.

5. The light source of claim 1 where each controller is a current source connected to a cathode end of a string of LEDs connected in series.

6. The light source of claim 5 further comprising a first voltage regulator connected to an anode end of the at least one LED of the first color, a second voltage regulator connected to an anode end of the at least one LED of the second color, and a third voltage regulator connected to an anode end of the at least one LED of the third color.

7. The light source of claim 6 wherein the first voltage regulator, the second voltage regulator, and the third voltage regulator are adjusted to provide a voltage drop across a respective current source of 1 volt or less.

8. The light source of claim 1 wherein the at least one LED of the first color comprises a plurality of LEDs of the first color connected in series.

9. The light source of claim 1 wherein the at least one LED of the second color comprises a plurality of LEDs of the second color connected in series.

10. The light source of claim 1 wherein the at least one LED of the third color comprises a plurality of LEDs of the third color connected in series.

11. The light source of claim 1 further comprising a reflective box at least partially surrounding the at least one LED of the first color, at least one LED of the second color, and at least one LED of the third color to mix the first color, second color, and third color.

12. The light source of claim 1 wherein the at least one LED of a first color comprises a plurality of LEDs of the first color, the at least one LED of a second color comprises a plurality of LEDs of the second color, and the at least one LED of a third color comprises a plurality of LEDs of the third color, wherein the LEDs of the first color, second color, and third color are arranged in clusters of at least one LED of the first color, at least one LED of the second color, and at least one LED of the third color, each cluster of LEDs being controlled by a respective controller for each color such that at least one cluster is controlled by at least three controllers to have a desired combined color point and brightness.

13. The light source of claim 12 wherein the clusters are housed in a reflective box at least partially surrounding the clusters, a cluster proximate to an edge of the box being controlled to have a brightness level lower than a brightness level of a cluster further from the edge of the box.

14. The light source of claim 1 wherein the at least one LED of the first color comprises a plurality of series strings of LEDs of the first color connected in parallel.

15. The light source of claim 1 wherein the plurality of controllers comprises a plurality of controllable linear current sources.

16. The light source of claim 1 further comprising a current level controller on the circuit board for receiving digital values from the memory and converting the digital values to signals for controlling the plurality of controllers.

17. The light source of claim 1 wherein the at least one LED of the first color comprises a plurality of LEDs of the first color connected in series, and wherein each current controller comprises:
    a constant current source connected to the plurality of LEDs of the first color connected in series;
    a transistor switch connected in parallel across at least one LED in the plurality of LEDs of the first color connected in series; and
    a pulse width modulated (PWM) controller connected to the transistor switch for setting a duty cycle of the switch to cause an average current magnitude, determined by the duty cycle, to pass through the at least one LED in the plurality of LEDs of the first color connected in series.

18. The light source of claim 17 wherein the transistor switch is connected in parallel across a group of LEDs in the plurality of LEDs of the first color connected in series.

19. The light source of claim 17 further comprising one or more additional transistor switches, each switch connected in parallel across at least one LED in the plurality of LEDs of the first color connected in series, and each switch being controlled by an associated PWM controller.

20. The light source of claim 17, wherein the PWM controller controls the duty cycle to achieve a target brightness of the first color.

21. The light source of claim 17 further comprising a PWM controller for blanking the output of the PWM controller at a duty cycle to control an overall brightness of the first color.

22. The light source of claim 17 further comprising a PWM controller for controlling the constant current source to apply either a full current or no current to the plurality of LEDs of the first color connected in series at a duty cycle to control an overall brightness of the first color.

23. The light source of claim 17 further comprising a controller for controlling a magnitude of the constant current source to control an overall brightness of the first color.

24. The light source of claim 17 wherein the at least one LED of the second color comprises a plurality of LEDs of the second color connected in series, and wherein each current controller further comprises:
- a constant current source connected to the plurality of LEDs of the second color connected in series;
- a transistor switch connected in parallel across at least one LED in the plurality of LEDs of the second color connected in series; and
- a pulse width modulated (PWM) controller connected to the transistor switch for setting a duty cycle of the switch to cause an average current magnitude, determined by the duty cycle, to pass through the at least one LED in the plurality of LEDs of the second color connected in series.

25. A method for producing a light source for use as a backlight comprising:
- providing on a circuit board at least one LED of a first color, at least one LED of a second color, and at least one LED of a third color;
- providing on the circuit board a plurality of current controllers, each controller connected to at least a cathode end of a respective one of the at least one LED of the first color, at least one LED of the second color, and at least one LED of the third color;
- providing on the circuit board a memory, values stored in the memory determining a current output of each of the controllers;
- controlling the plurality of controllers to vary brightness levels of the at least one LED of the first color, at least one LED of the second color, and at least one LED of the third color while detecting a combined light output of the at least one LED of the first color, at least one LED of the second color, and at least one LED of the third color;
- determining control signals for the plurality of controllers needed to obtain a target light output of the board from the combination of the first color, second color, and third color; and
- storing in the memory values corresponding to the control signals needed to obtain the target light output.

26. The method of claim 25 wherein the at least one LED of a first color comprises a plurality of LEDs of the first color, the at least one LED of a second color comprises a plurality of LEDs of the second color, and the at least one LED of a third color comprises a plurality of LEDs of the third color, wherein the LEDs of the first color, second color, and third color are arranged in clusters of at least one LED of the first color, at least one LED of the second color, and at least one LED of the third color, wherein each cluster of LEDs is controlled by a respective controller for each color such that a first cluster is controlled by at least three controllers to have a desired brightness level and color point, the method further comprising storing in the memory values for setting brightness levels of the first cluster and the second cluster to be different.

27. The method of claim 25 further comprising:
- downloading the values stored in the memory to control the plurality of controllers; and
- energizing the at least one LED of a first color, at least one LED of a second color, and at least one LED of a third color to obtain the same target light output achieved when determining control signals for the plurality of controllers needed to obtain the target light output.

28. The method of claim 27 wherein the first color is red, the second color is green, and the third color is blue, wherein downloading the values in memory causes the controllers to control the relative brightness of the red, green, and blue colors to achieve the target light output.

29. The method of claim 25 wherein the at least one LED of the first color comprises a plurality of LEDs of the first color connected in series, and wherein each current controller comprises:
- a constant current source connected to the plurality of LEDs of the first color connected in series;
- a transistor switch connected in parallel across at least one LED in the plurality of LEDs of the first color connected in series; and
- a pulse width modulated (PWM) controller connected to the transistor switch,
- wherein the step of controlling the plurality of controllers to vary brightness levels comprises setting a duty cycle of the switch to cause an average current magnitude, determined by the duty cycle, to pass through the at least one LED in the plurality of LEDs of the first color connected in series.

30. The method of claim 29 wherein the transistor switch is connected in parallel across a group of LEDs in the plurality of LEDs of the first color connected in series.

31. The method of claim 29 further comprising one or more additional transistor switches, each switch connected in parallel across at least one LED in the plurality of LEDs of the first color connected in series, and each switch being controlled by an associated PWM controller, wherein the step of controlling the plurality of controllers to vary brightness levels comprises setting duty cycles of the switches to cause an average current magnitude, determined by each duty cycle, to pass through the associated at least one LED in the plurality of LEDs of the first color connected in series.

* * * * *